United States Patent [19]
Lee

[11] Patent Number: 5,360,751
[45] Date of Patent: Nov. 1, 1994

[54] METHOD OF MAKING A CELL STRUCTURE FOR A PROGRAMMABLE READ ONLY MEMORY DEVICE

[75] Inventor: Roger R. Lee, Boise, Id.

[73] Assignee: Micron Technology, Inc., Boise, Id.

[21] Appl. No.: 114,263

[22] Filed: Aug. 30, 1993

Related U.S. Application Data

[63] Continuation of Ser. No. 850,740, Mar. 12, 1992, Pat. No. 5,241,202.

[51] Int. Cl.$^5$ .......................................... H01L 21/265
[52] U.S. Cl. ........................................ 437/35; 437/43; 437/984
[58] Field of Search ............... 437/43, 49, 984, 35; 257/315, 316

[56] References Cited

U.S. PATENT DOCUMENTS 5,021,848  6/1991  Chiu ............................. 357/235
5,192,872  3/1993  Lee ............................... 257/315
5,241,202  8/1993  Lee ............................... 257/315

*Primary Examiner*—George Fourson
*Assistant Examiner*—Richard A. Booth
*Attorney, Agent, or Firm*—Kevin D. Martin

[57] ABSTRACT

A fabrication method for a PROM cell allows improved, lower voltage programming and reduced leakage of the charge from the floating gate to the substrate (channel) region. The inventive cell uses a thin gate oxide layer along with a floating gate which is lightly doped except on one edge. This edge, for example near the drain region, is heavily doped with an angled implant. The thin gate oxide functions as thick oxide under the lightly doped region, thereby preventing the leakage and high coupling between the substrate and floating gate of a conventional thin oxide layer. The thin oxide under the heavily doped areas of the floating gate functions as thin oxide, thereby allowing improved, lower voltage programming.

12 Claims, 3 Drawing Sheets

METHOD OF MAKING A CELL STRUCTURE FOR A PROGRAMMABLE READ ONLY MEMORY DEVICE

CROSS REFERENCE TO RELATED APPLICATION

This is a continuation of Ser. No. 850,740, filed Mar. 12, 1992, now U.S. Pat. No. 5,241,202.

FIELD OF THE INVENTION

This invention relates to the field of semiconductor devices. More specifically, a cell structure for Programmable Read-Only Memories (PROM) is described which has decreased coupling between the floating gate and the substrate, has increased resistance to leakage, and allows for a lower programming voltage. The inventive structure is especially useful in the manufacture of Flash Electrically Erasable Proms ($E^2$PROMs).

BACKGROUND OF THE INVENTION

Erasable Programmable Read-only Memories (EPROMs), Electrically Erasable Programmable Read-only Memories ($E^2$PROMs), and Flash $E^2$PROMs (hereafter collectively, PROMs) have several structures which allow them to hold a charge without refresh for extended periods of time. FIG. 1 shows a top view of a PROM array, FIG. 2 shows a cross section along "AA" of FIG. 1, and FIG. 3 shows a cross section along "BB" of FIG. 1. The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the "control gate" 14 or P2. P1 10 and P2 14 act as the two plates of a capacitor. Below the P1 layer are two N+ junctions, one which acts as the transistor source 16 and the other as the drain 18, which are doped into a P-type substrate 20. The portion of the substrate 20 between the source 16 and the drain 18 is the channel 22. The cell functions like an enhancement-type N-channel metal oxide semiconductor field effect transistor (MOSFET) with two gates of poly.

There are structures that make up a PROM array which are common to several transistors in the array. FIG. 1 shows the transistor sources 16, drains 18, digit lines 24, floating gates 10, and control or "word" lines 26 which form control gates 14 as they pass over the floating gates 10. Also shown as a dotted line is the "active area" 28 interspersed with areas of field oxide 30. A single word line 26 is common to all transistors in a single column acting as a control gate 14 for all transistors in the column. When the word line is selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 of all transistors in a single row.

The potential which must be applied on the control gate to turn on the transistor is much higher in a device storing a charge than in a device which does not have a potential stored on P1. To read the content of the floating gate, a potential somewhere between the low and high potential values (i.e. the threshold voltage $V_t$) is applied to the control gate. If a cell is set to a zero, arbitrarily defined by storing −3 V on the floating gate 10, and 3.5 V is applied to the control gate, the net difference in potential which effects the transistor channel is not great enough to allow the electrons to pass from the source to the drain. Assuming a 0.7 coupling coefficient (described below) the effect on the transistor is defined as $-3.0\ V + (3.5\ V \times 0.7) = -0.55\ V$. If $V_t$ is 1.0 V, the transistor will not trip. If a cell is set to a one, arbitrarily defined by storing 0 V on the floating gate 10, the 3.5 V difference between the control gate and the floating gate will affect the channel greatly enough to allow electrons to pass between the source and drain. Assuming the same 0.7 coupling coefficient, the effect on the transistor is defined as $0\ V + (3.5\ V \times 0.7) = 2.45\ V$. After the control gate 26 is activated, each cell along that control gate 26 outputs the cell information on their respective digit lines 24, either an OFF if the floating gate is storing a −3.0 V or an ON if the cell is storing 0.0 V. The information on the digit line 24 which corresponds to the cell to be read is obtained with a sense amplifier (not shown), with one sense amp for each digit line.

In a conventional Flash $E^2$PROM cell, the floating gate and the control gate are both manufactured from N-type poly. The floating gate and control gate are both highly doped with N+ material. The substrate is P-type conductivity with N+ junctions which form the source and drain regions. To manufacture N-type poly, a poly structure is doped with atoms having more than four valence electrons (group V or higher), such as arsenic or phosphorus, which introduces negatively charged majority carriers into the silicon and make the semiconductive material much more conductive than nondoped poly due to electron conduction. To manufacture P-type poly, a poly structure is doped with atoms having less than four valence electrons (group III or lower), such as boron, which introduce positively charged majority carriers and make the semiconductive material more conductive than undoped poly due to hole conduction but less conductive than N-type doped poly. The majority charge carrier type is also referred to as conductivity type.

There are many ways to program a PROM. In one technique, a potential such as 12 V, for example, is applied on the control gate. Simultaneously, a voltage pulse, for example 8 V, is applied between source and drain. The large positive potential on the control gate establishes an electric field in the insulating oxide. This electric field attracts the electrons generated from the so-called "avalanche breakdown" of the transistor due to the high drain and control gate potentials, and accelerates them toward the floating gate, which they enter through the oxide dielectric. In this way the floating gate is charged, and the charge that accumulates on it becomes trapped.

The amount of electron flow is determined partly by the thickness of the gate oxide. If the gate oxide is very thin, the electron flow can be relatively large. In this case, a lower voltage can be applied on the drain and control gate. If the oxide is thicker, the electron flow is small and a large potential must be applied to the drain and control gate to influence the electrons to pass through the gate oxide to the floating gate.

Another programming method is by Fowler-Nordheim tunneling. By applying a high potential on the word line and grounding the source and/or the drain, electrons will tunnel through the thin gate oxide to the floating gate. Fowler-Nordheim tunneling is critically determined by the potential between the control gate and the source and/or drain (and therefore the electric field) and the thickness of the gate oxide.

To return the floating gate from a charged state to a state with no charge (erase), the electrons are caused to return to the substrate. In an EPROM, this is accomplished with ultraviolet light which excites the electrons past a certain energy state, thereby allowing them to pass through the oxide and return to the substrate. In an E$^2$PROM, this excitation is accomplished with an electrical field.

The floating gate of an E$^2$PROM forms a capacitor with the control gate, as described above, and also with the source, the drain, and the channel. This arrangement is described in FIG. 4. The coupling capacitances associated with P1 are described by the coupling coefficient, which is depicted by the equation (referring to FIG. 2):

$$CC = \frac{C1}{(C1 + C2 + C3 + C4)}$$

where CC is the coupling coefficient, C1 represents the coupling between P1 and P2, C2 represents the coupling between P1 and the source, C3 represents the coupling between P1 and the drain, and C4 represents the coupling between P1 and the channel. As can be determined from the equation, the coupling coefficient can never reach the ideal state (1.00) since the capacitance between the floating gate and the control gate is always divided by itself plus some additional capacitance. Still, the goal of designers is to bring the coupling coefficient as close to unity as possible.

The coupling between the floating gate and the channel (C4 in the equation above) is partially determined by the thickness of the gate oxide under the floating gate. Thinning the oxide has various advantageous and detrimental effects on the functionality of the cell. With a relatively thin gate oxide, which can range from 100 Å to 150 Å with current technology, the cell requires less voltage to program. The thinner gate oxide allows an easier passage of the electrons from the source (or drain) region to the floating gate, thereby requiring less voltage to program the array. In addition to requiring less power, the programming of one cell does not as greatly affect an adjacent cell (less disturbance), and the data is more reliably written into the cell with the thinner gate oxide. Thinning the gate oxide, however, increases the capacitance between the floating gate and the substrate as the two "plates" of the capacitor are closer together. As seen in the equation above, this decreases the coupling coefficient. A thin gate oxide, while an aid in programming, adversely affects the storage of the charge on the floating gate for the same reason, that electrons can more easily pass through the gate oxide, and can therefore discharge from the floating gate to the substrate.

Conversely, a cell with a thicker gate oxide, for instance from about 150 Å to 250 Å, has a larger distance between the two plates of the capacitor (the floating gate and the transistor channel region) and a coupling coefficient which isn't adversely affected by C4. This cell has a thicker tunneling dielectric, and therefore an excellent storage of the charge on the floating gate as the charge doesn't easily leak from the floating gate to the substrate through the thick gate oxide. However, it is difficult to program this cell, and programming requires a higher potential. This increases power consumption and the programming of one cell can adversely affect an adjacent cell.

Attempts have been made to create a cell with a large percentage of thick gate oxide under the floating gate for good storage of the charge, and an area under the floating gate having thin gate oxide to allow for low voltage programming. While a cell with these specifications functions effectively, attaining this structure reliably has proven to be difficult, especially with high density devices. A more easily manufacturable PROM cell having the advantages of both thick and thin gate oxide would be a desirable structure.

SUMMARY OF THE INVENTION

An object is to provide a PROM structure which has a self-aligned tunneling window. Another object of the invention is to provide a PROM structure which uses less voltage during programming. Another object of the invention is to provide a PROM structure which has increased resistance to cell interference during programming by virtue of its lower programming voltage. Yet another object of the invention is to provide a PROM structure which has less leakage. Still another object of the invention is to provide a PROM structure which has increased coupling coefficient.

These objects of the invention are realized by lightly doping the floating gate of a floating gate transistor with N-type material, and heavily doping one edge of the floating gate. The thin oxide under the lightly doped floating gate areas effectively acts as a thick oxide barrier due to the depletion layer generated within the floating gate during programming, thereby preventing the leakage of electrons from the floating gate to the channel region. The thin gate oxide under the heavily doped floating gate region allows for the passage of electrons during programming, thereby allowing the cell to be programmed with a lower potential. Cells in the array are thereby not as greatly affected by the programming of adjacent cells.

The tunneling window of the structure is self-aligned as a result of its formation by angle doping the floating gate to form an area of high dopant concentration.

DETAILED DESCRIPTION OF THE INVENTION

Figure 1:
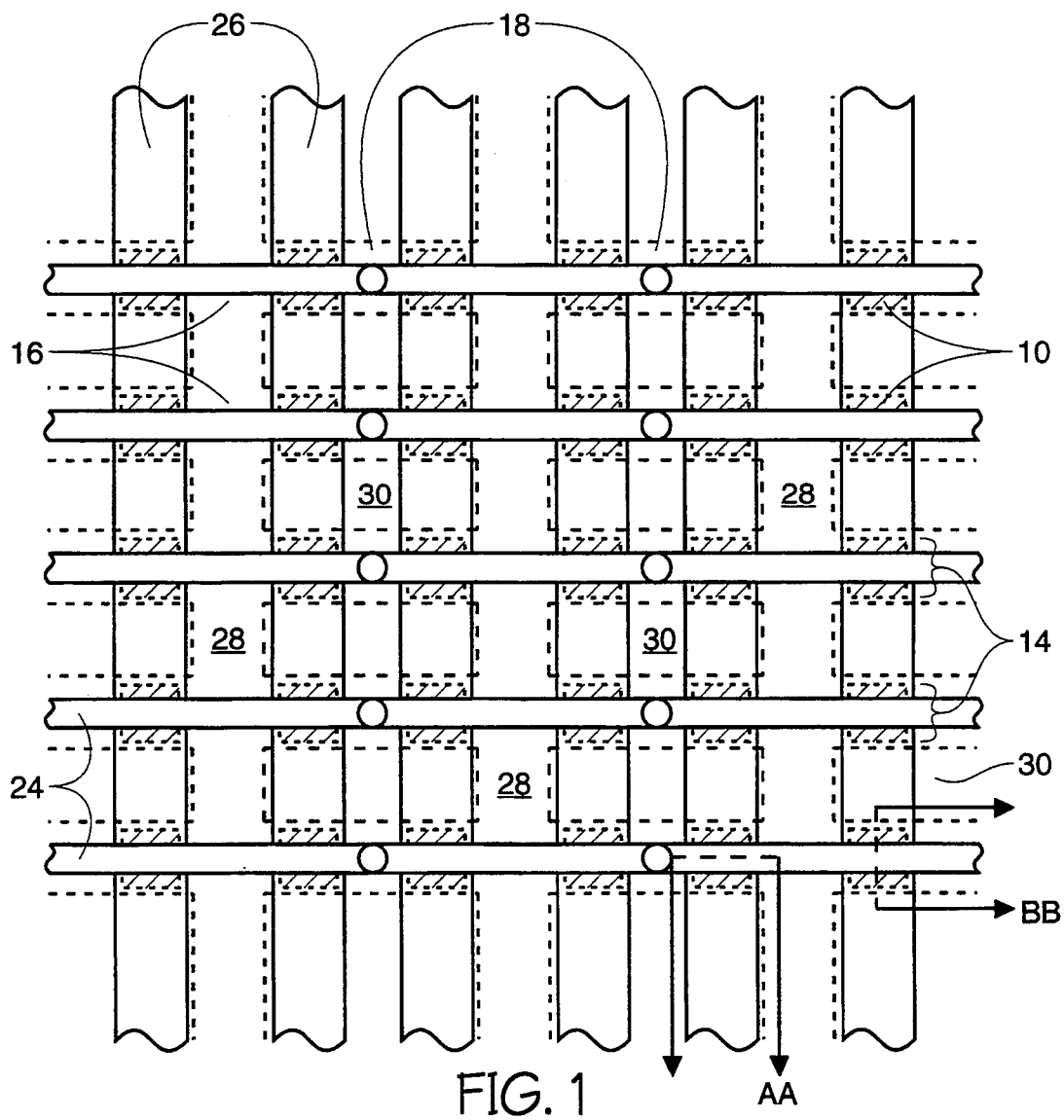
FIG. 1 is a top view of a PROM array.
Figure 2:
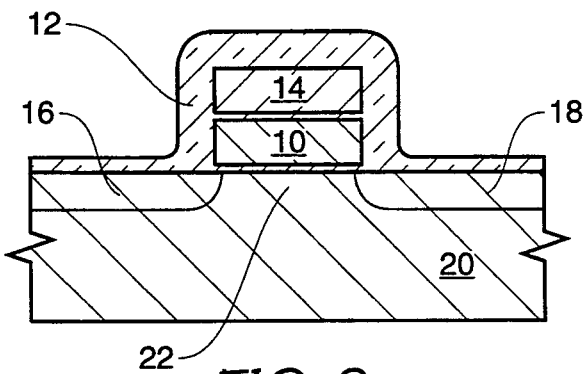
FIG. 2 is a cross section of the FIG. 1 PROM array along section "AA"
Figure 3:
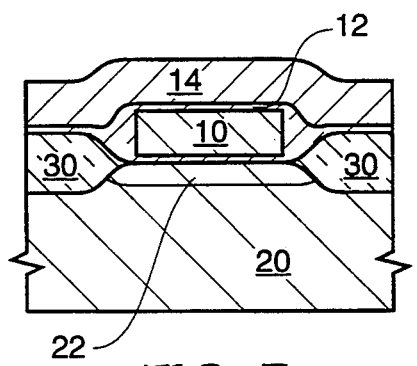
FIG. 3 is a cross section of the FIG. 1 PROM array along section "BB"
Figure 4:
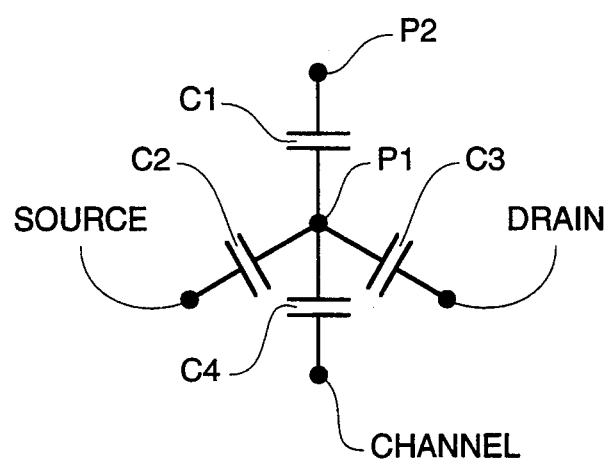
FIG. 4 shows the capacitances associated with the cell structures of an EPROM.
Figure 5:
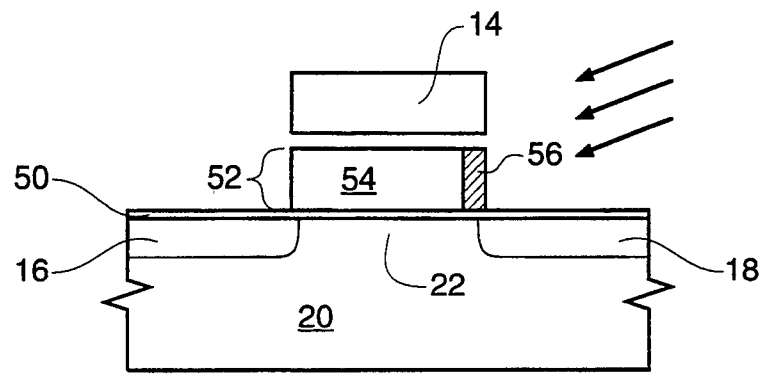
FIG. 5 is a cross section of a first embodiment having one edge of the floating gate heavily implanted with the remaining areas of the floating gate lightly doped.

FIG. 5 shows a cross section of a first embodiment of the invention. An E$^2$PROM cell is manufactured having a thin gate oxide layer, for example between 100 Å and 200 Å, up to formation of the floating gate poly 52. The floating gate poly 52 is lightly doped, for example with an N-type material. The lightly doped floating gate poly 54 of the inventive cell is in contrast with a conventionally formed E²PROM cell which has a heavily doped floating gate poly. The concentration of the dopant (for example phosphorous, arsenic, or antimony) in the lightly doped regions can be from about $10^{16}$–$10^{18}$ atoms/cm$^3$ or to other workable concentrations. Next, the doped word line 14 is formed over the floating gate poly 52. An angled implant heavily dopes one edge of the floating gate 56 to a concentration of about $10^{19}$–$10^{21}$ atoms/cm$^3$, or to other workable concentrations. Structure formation continues in accordance with known techniques.

The thin oxide 50 under the lightly doped floating gate area 54 functions as a much thicker oxide when a positive voltage is applied to the word line (control gate) 14 during programming or a normal read operation, thereby decreasing the capacitance between the floating gate and the substrate, and decreasing leakage between the two structures. Therefore, between the lightly doped floating gate 54 and the substrate 20 the nondegenerate (depletion) layer acts as a much thicker oxide layer. Under the portion of the floating gate which is heavily doped 56, the thin oxide 50 allows for a low voltage programming as there is higher effective vertical electric field in the highly doped region during programming. This improves both hot electron programming and Fowler-Nordheim tunneling programming efficiency. A 5 V drain/source potential with 10 V gate/source voltage programming may be possible for hot electron programming, and less than 12 V gate/source voltage for Fowler-Nordheim programming is possible. A more consistent and uniform erase may also result from the inventive structure due to the lighter floating gate poly doping near the source.

Figure 6:
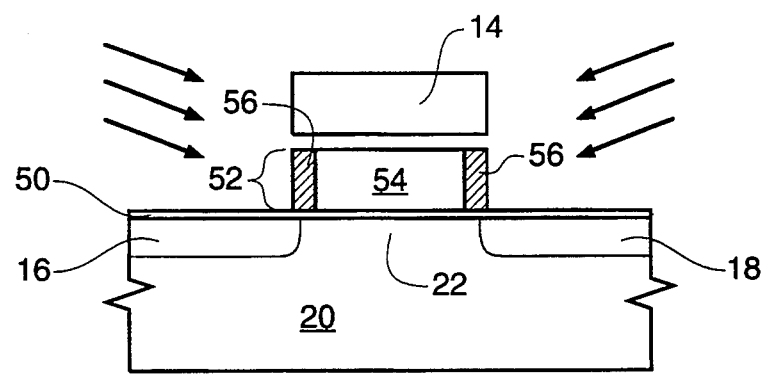
FIG. 6 is a cross section of a second embodiment having the two outer edges of the floating gate heavily implanted with the remaining areas of the floating gate lightly doped.

FIG. 6 is a cross section of a second embodiment of the invention. The FIG. 6 embodiment is much like the FIG. 5 embodiment, except that both sides 56 of the floating gate 52 are heavily doped with the lightly doped area 54 interposed therebetween. This would allow for easier programming than the FIG. 5 embodiment, but may also allow for more leakage and lower coupling coefficient.

Figure 7:
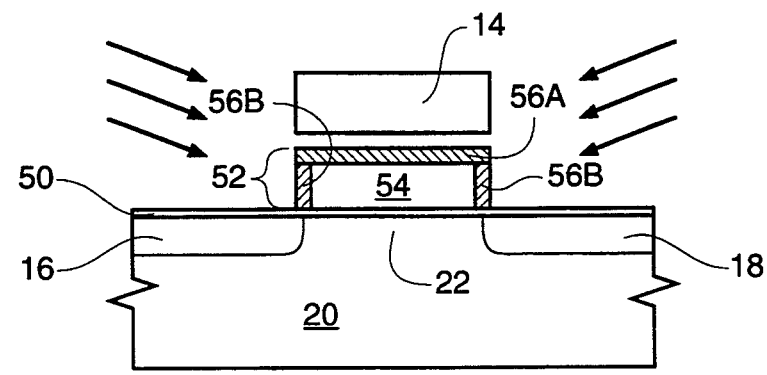
FIG. 7 is a cross section of a third embodiment having the two outer edges and the top of the floating gate heavily implanted with the remaining areas of the floating gate lightly doped.

FIG. 7 is a cross section of a third embodiment. To create this structure, the cell is fabricated up to the floating gate poly 52. The floating gate poly is lightly doped 54, then the upper region of the gate poly is heavily doped 56A with an N-type material such as phosphorous, arsenic, or antimony. The control gate 14 is formed, and the sides of the floating gate 56B are heavily implanted.

During Fowler-Nordheim tunneling erase, a high potential is applied to the source and the control gate is grounded. The advantage of having the top of the floating gate heavily doped (as shown in FIG. 7) is that it avoids generating an undesirable depletion layer on top of the floating gate. Otherwise, this undesirable depletion layer will decrease the capacitance between poly 1 and poly 2, which determines the coupling coefficient. A cell with a higher coupling coefficient has improved erase characteristics when compared with a cell having a lower coupling coefficient. The structure results in a cell wherein the coupling coefficient between the control gate and the floating gate is affected by changing the potential on the control gate, which affects the floating gate depletion layer.

In each of the embodiments described above, the already heavily doped control gate is further doped during the angled doping of the floating gate, which has no significant effect on the conductivity of the word line.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, various materials other than those described may be used for the gates, and other doping and substrate materials may be workable. It is therefore contemplated that the appended claims will cover any such modifications or embodiments as fall within the true scope of the invention.

I claim:

1. A process for forming a semiconductor device having a substrate and a plurality of cells comprising the following steps:
   a) doping a first substrate region to form a transistor source;
   b) doping a second substrate region to form a transistor drain;
   c) providing a transistor channel interposed between said source and said drain;
   d) forming a first insulating layer over said channel;
   e) forming a first conductive layer over said channel;
   f) lightly doping said first conductive layer with an impurity to form a lightly doped region in said first conductive layer;
   g) forming a second insulating layer over said first conductive layer;
   h) forming a second conductive layer over said first conductive layer; and
   i) angle doping a side of said first conductive layer to form a heavily doped region in said first conductive layer,
   whereby said heavily doped region in said first conductive layer provides a self-aligned tunneling window through said first insulating layer.

2. The process of claim 1 further comprising the step of angle implanting a second side of said first conductive layer such that said first conductive layer has a lightly doped region interposed between two heavily doped regions.

3. The process of claim 1 further comprising the step of heavily doping an upper surface of said first conductive layer before the step of providing said second conductive layer.

4. The process of claim 1 wherein said heavily doped region of said first conductive layer is doped to an impurity concentration of between about $10^{18}$ and $10^{22}$ atoms/cm$^3$ and said lightly doped region of said first conductive layer is doped to an impurity concentration of between about $10^{15}$ and $10^{18}$ atoms/cm$^3$.

5. A process for forming an erasable programmable read-only memory device having a substrate and a plurality of cells comprising the following steps:
   a) doping a first substrate region to form a transistor source;
   b) doping a second substrate region to form a transistor drain;
   c) providing a transistor channel interposed between said source and said drain;
   d) forming gate oxide over said channel;
   e) forming a floating gate over said channel;

f) lightly doping said floating gate with an impurity to form a lightly doped region in said floating gate;

g) forming a second oxide layer over said floating gate;

h) forming a control gate over said floating gate and over said second oxide layer; and i) angle doping a side of said floating gate to form a heavily doped region in said floating gate, whereby said heavily doped region in said floating gate provides a self-aligned tunneling window through said gate oxide.

6. The process of claim 5 further comprising the step of angle implanting a second side of said floating gate such that said floating gate has a lightly doped region interposed between two heavily doped regions.

7. The process of claim 5 further comprising the step of heavily doping an upper surface of said floating gate before the step of providing said control gate.

8. The process of claim 5 wherein said heavily doped region of said floating gate is doped to an impurity concentration of between about $10^{18}$ and $10^{22}$ atoms/cm$^3$ and said lightly doped region of said floating gate is doped to an impurity concentration of between about $10^{15}$ and $10^{18}$ atoms/cm$^3$.

9. A process for forming an electrically erasable programmable read-only memory device having a substrate and a plurality of cells comprising the following steps:

a) doping a first substrate region to form a transistor source;

b) doping a second substrate region to form a transistor drain;

c) providing a transistor channel interposed between said source and said drain;

d) forming gate oxide over said channel, said gate oxide having a thickness of between 100 Å and 200 Å;

e) forming a floating gate over said channel;

f) lightly doping said floating gate with a first impurity to form a lightly doped region in said floating gate, said first impurity comprising a material selected from the group consisting of phosphorous, arsenic, and antimony;

g) forming a second oxide layer over said floating gate;

h) forming a control gate over said floating gate and over said second oxide layer; and i) angle doping a side of said floating gate to form a heavily doped region in said floating gate, whereby said heavily doped region in said floating gate provides a self-aligned tunneling window through said gate oxide.

10. The process of claim 9 further comprising the step of angle implanting a second side of said floating gate such that said floating gate has a lightly doped region interposed between two heavily doped regions.

11. The process of claim 9 further comprising the step of heavily doping an upper surface of said floating gate before the step of providing said control gate.

12. The process of claim 9 wherein said heavily doped region of said floating gate is doped to an impurity concentration of between about $10^{18}$ and $10^{22}$ atoms/cm$^3$ and said lightly doped region of said floating gate is doped to an impurity concentration of between about $10^{15}$ and $10^{18}$ atoms/cm$^3$.

* * * * *